(12) United States Patent
Opsitos, Jr.

(10) Patent No.: US 7,710,743 B2
(45) Date of Patent: May 4, 2010

(54) REMOTE ID RESISTOR ASSEMBLY FOR WIRING HARNESS

(75) Inventor: Robert J. Opsitos, Jr., Felton, PA (US)

(73) Assignee: Black & Decker Inc., Newark, DE (US)

( * ) Notice: Subject to any disclaimer, the term of this patent is extended or adjusted under 35 U.S.C. 154(b) by 263 days.

(21) Appl. No.: 11/553,683

(22) Filed: Nov. 22, 2006

(65) Prior Publication Data

US 2007/0188984 A1 Aug. 16, 2007

Related U.S. Application Data

(60) Provisional application No. 60/731,853, filed on Nov. 1, 2005.

(51) Int. Cl.
*H02B 1/20* (2006.01)

(52) U.S. Cl. ........................ 361/826; 361/825

(58) Field of Classification Search ................ 361/760, 361/826, 825, 741, 730
See application file for complete search history.

(56) References Cited

U.S. PATENT DOCUMENTS

| | | | | |
|---|---|---|---|---|
| 4,850,884 A | * | 7/1989 | Sawai et al. ................ 439/76.2 |
| 5,646,501 A | * | 7/1997 | Fishman et al. ............. 320/112 |
| 6,013,991 A | * | 1/2000 | Philipp ....................... 318/139 |
| 6,286,609 B1 | * | 9/2001 | Carrier et al. .................. 173/1 |
| 6,392,530 B2 | * | 5/2002 | Suzuki ........................ 338/320 |
| 6,501,211 B1 | * | 12/2002 | Nasrollahzadeh ........... 310/338 |
| 6,509,659 B1 | | 1/2003 | Carroll et al. |
| 6,926,558 B2 | * | 8/2005 | Sasai et al. ............. 439/620.04 |
| 7,028,202 B2 | * | 4/2006 | Long et al. .................. 713/340 |
| 2001/0033478 A1 | * | 10/2001 | Ortiz et al. .................. 361/818 |
| 2003/0090239 A1 | * | 5/2003 | Sakakibara ................. 320/166 |
| 2003/0165736 A1 | * | 9/2003 | Hiratsuka ................... 429/153 |
| 2004/0085193 A1 | | 5/2004 | Crowell |
| 2004/0240187 A1 | | 12/2004 | Takabatake et al. |
| 2005/0247761 A1 | * | 11/2005 | Albanese et al. ............ 228/201 |

FOREIGN PATENT DOCUMENTS

| | | |
|---|---|---|
| EP | 0374007 | 6/1990 |
| WO | WO 2005/009797 | 2/2005 |

OTHER PUBLICATIONS

European Search Report issued Mar. 27, 2007 in corresponding European Patent Application No. 06123281.

* cited by examiner

*Primary Examiner*—Hung S Bui
(74) *Attorney, Agent, or Firm*—Harness, Dickey & Pierce, P.L.C.

(57) ABSTRACT

A printed circuit board (PCB) connector assembly for a wiring harness is disclosed. The PCB connector assembly may include a PCB, a connector housing disposed on a surface of the PCB, and a plurality of ID resistors for identifying data and limiting voltages through the cordless power tool. The ID resistors are mounted on the surface of the PCB. An encapsulant covers the plurality of ID resistors.

11 Claims, 7 Drawing Sheets

REMOTE ID RESISTOR ASSEMBLY FOR WIRING HARNESS

PRIORITY STATEMENT

This U.S. non-provisional patent application claims priority to provisional application 60/731,853, filed Nov. 1, 2005, the entire contents of which are hereby incorporated by reference.

BACKGROUND

1. Field of the Invention

Example embodiments relate generally to identification resistors in a wire harness for cordless power tools.

2. Description of Related Art

Cordless products which use rechargeable batteries are prevalent throughout the workplace as well as in the home. From house wares to power tools, rechargeable batteries are used in numerous devices. Ordinarily, nickel—cadmium (NiCd), nickel metal hydride (NiMH) and/or Lithium-ion (Li-ion) battery cells are used in these devices.

Various battery technologies can be damaged when discharged in excess of the manufacturer's recommendations. Accordingly, circuitry to prevent current flow is required to protect the pack when a battery voltage drops below a given voltage threshold, referred to as an under-voltage lockout. For example, a protection circuit in the battery pack and/or tool can sense the battery voltage, and if the voltage drops below a given voltage level the circuit directs turning off of , a discharge semiconductor device (e.g., a discharge FET) in the pack. As a result, battery cells are still susceptible to charge but will not discharge.

Accordingly, conventional battery unit with charge/discharge control and over-discharge protection is designed primarily for low-voltage portable electronic devices. Such devices are characterized by using battery packs of secondary batteries cells (such as Li-ion, NiCd, NiMH) that provide a maximum output voltage of about 4.2 volts/cell, for example.

However, much higher voltages than described above are required for power electronic devices such as cordless power tools. Accordingly, modified NiCd battery packs that provide the same or greater power at lower weight, and Li-ion battery packs which may provide higher voltage outputs than current Li-ion batteries, and at a much reduced weight (as compared to NiCd or NiMH), are being developed. A characteristic of these battery packs is that both batteries may exhibit substantially lower impedance characteristics than conventional Li-ion, NiCd and NiMH batteries.

However, as these battery technologies advance, the introduction of lower impedance chemistries and construction styles to develop secondary batteries generating substantially higher output voltages (such as at least 11 V and up, for example) can create compatibility issues with existing cordless power tools. Battery packs having lower impedance also means that the pack can supply substantially higher current to an attached electronic component, such as a power tool. As current through a motor of the attached tool increases, demagnetization forces (e.g., the number of armature turns of the motor times the current, ampere-turns) could substantially increase beyond a desired or design limit in the motor. Such undesirable demagnetization could thus potentially burn up the motor.

For example, a lower impedance electrical source could cause damage to a tool's motor when the tool is held at stall condition. During motor stall, the motor and battery impedances are the only mechanisms to limit the current since there is no back-EMF created by the motor. With a lower impedance pack, the currents would be higher. Higher currents through the motor might cause a stronger de-magnetization force than what the tool's permanent magnets were designed to withstand.

Additionally, start-up of the tool could produce excessive starting currents and cause demagnetization of the motor. Thermal overload could also be a result of using a low impedance electrical source in an existing power tool, as the new batteries may be designed to run longer and harder than what the original cordless tool system was designed. Accordingly, over-discharge or current limiting controls may need to be in place before these developing lower-impedance batteries may be use with existing cordless power tools, for example.

One approach has been to use identification (ID) resistors in the tools to identify the information received from the battery pack. The battery pack may be configured for communicating and sensing information from the tool through communication terminals in the pack. Upon communication of this data, the ID resistors act to place restrictions of the maximum power and current through the battery pack. However, most conventional ID resistors are large and take up a substantial amount of space in the power tool.

SUMMARY

An example embodiment is directed to a printed circuit board (PCB) connector assembly for a wiring harness. The assembly may include a printed circuit board (PCB), a connector housing disposed on a surface of the PCB, and a plurality of ID resistor, for identifying data and limiting voltages through the cordless power tool. The ID resistors are mounted on the surface of the PCB. An encapsulant covers the plurality of ID resistors.

BRIEF DESCRIPTION OF THE DRAWINGS

The present invention will become more apparent by describing, in detail, example embodiments thereof with reference to the attached drawings, wherein like procedures are represented by like reference numerals, which are given by way of illustration only and thus do not limit the present invention.

DETAILED DESCRIPTION OF EXAMPLE EMBODIMENTS

It should be noted that these figures are intended to illustrate the general characteristics of method and apparatus of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

As used herein, power tools may be understood as a cordless power tool with the use of light-weight portable power sources, such as Li-ion battery packs that may provide the commensurate power with its use. Example power tools may include, but are not limited to, drills, high torque impact wrenches, single-handed metal working tools, nailers, hand planers, circular saws, jig saws, variable speed belt sanders, reciprocating saws, two handed drills such as rotary and demolition hammerdrills, routers, cut-off tools, plate joiners, drill presses, table saws, planers, miter saws, metal working tools, chop saws, cut-off machines, bench grinders, etc. Some of these tools may currently be commercially available only in a corded version, but may become cordless. These classifications are not intended to be inclusive of all power tools in which example embodiments of the present invention may be applied, but are only illustrative.

It should further be appreciated by one skilled in the art that the battery pack includes a plurality of battery cells disposed within a battery pack housing. The battery pack may be embodied as at least one of a lithium ion (Li-ion), a nickel cadmium (NiCd), a nickel metal hydride (NiMH) and a lead-acid battery pack, for example, in terms of the chemistry makeup of individual cells, electrodes and electrolyte of the battery pack. The battery cells may be connected in series and/or parallel.

Figure 1:
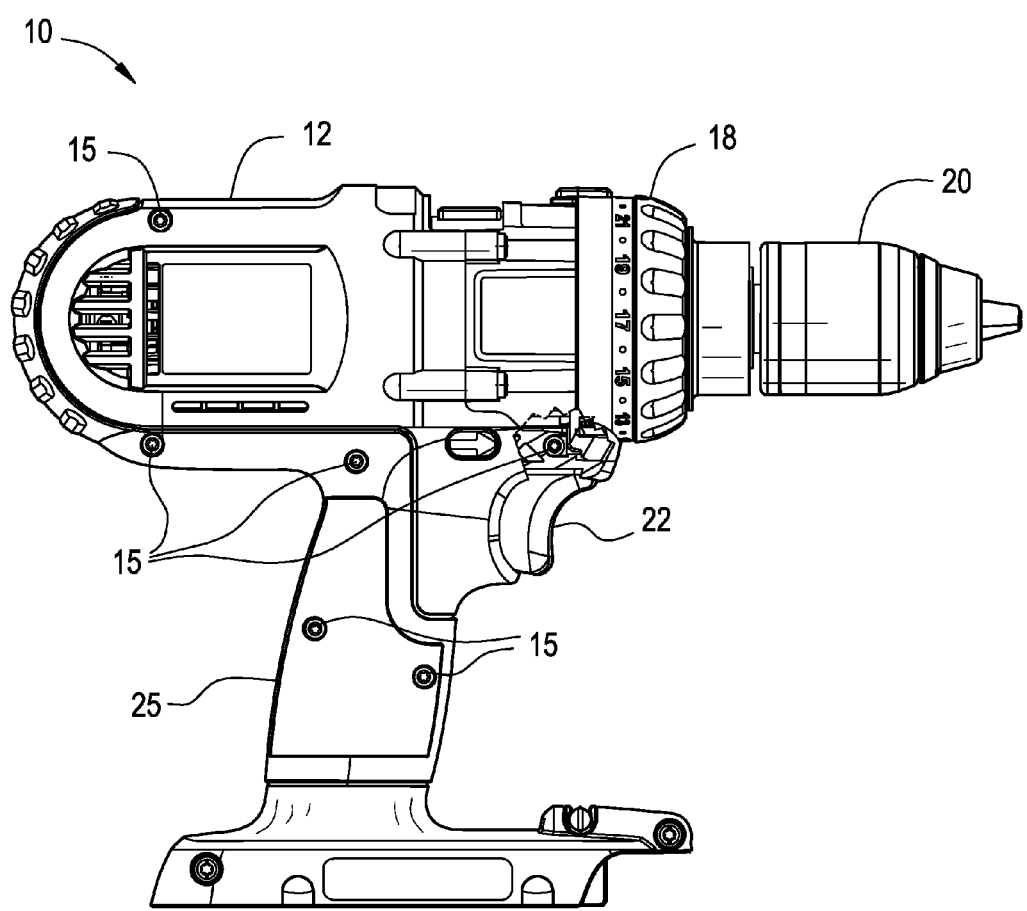
FIG. 1 is a side view of a cordless power tool in accordance with an example embodiment of the present invention.

FIG. 1 is a side view of a cordless power tool according to an example embodiment. Referring to FIG. 1, an example cordless power tool may be generally indicated by reference numeral 10 which designates a drill, and may include a housing 12, a motor assembly 13 (shown in FIG. 3), a multi-speed transmission assembly 16 (shown in FIG. 3), a clutch mechanism 18, a chuck 20, a trigger assembly 22, and a handle 25. The housing 12 is preferably molded from a suitable plastic material, such as polyethylene, polypropylene, or polyurethane. The housing 12 may be injection molded having two half portions 12A, 12B secured together in a conventional manner using mechanical fasteners, such as screws 15.

It should be understood to those skilled in the art that components of the power tool 10, such as the motor assembly 14, the transmission assembly 16, the chuck 20 and the trigger assembly 22, are conventional in nature and therefore will not be discussed in detail in the present application.

A battery pack (not shown) may be attached to a bottom portion of the power tool 10. The battery pack may be a rechargeable high power Li-ion battery pack comprised of a plurality of Li-ion cells, for example. However, it should be appreciated that other battery cells make-up, such as, nickel cadmium (Ni—Cd), nickel metal hydride (Ni—MH) and lead-acid battery pack, may be employed.

Figure 2:
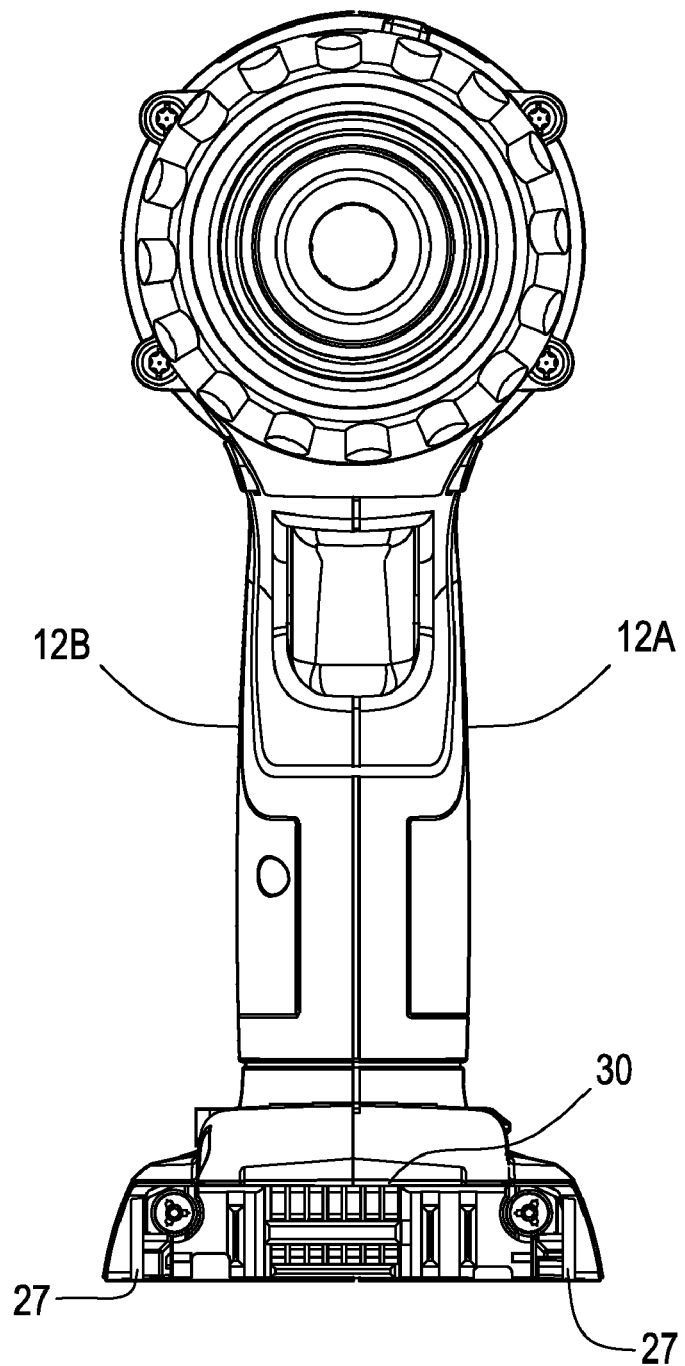
FIG. 2 is a front view of a cordless power tool in accordance with an example embodiment of the present invention.

Referring to FIG. 2, grooves 27 are positioned laterally at side ends at the bottom of tool 10 to facilitate releasable insertion or removal of the battery pack and the tool 10. The grooves 27 are slidably received by cooperating guide rails on the battery pack, so that insertion and removal of the pack is facilitated. The groove-rail arrangement is described in detail in co-pending U.S. patent application Ser. No. 11/553,355 to Adam Casalena et al., filed Oct. 26, 2006 and entitled "Battery Pack, Charger and Terminal Block Arrangements for Cordless Power Tool System", which is hereby incorporated by reference in its entirety herein.

Figure 3:
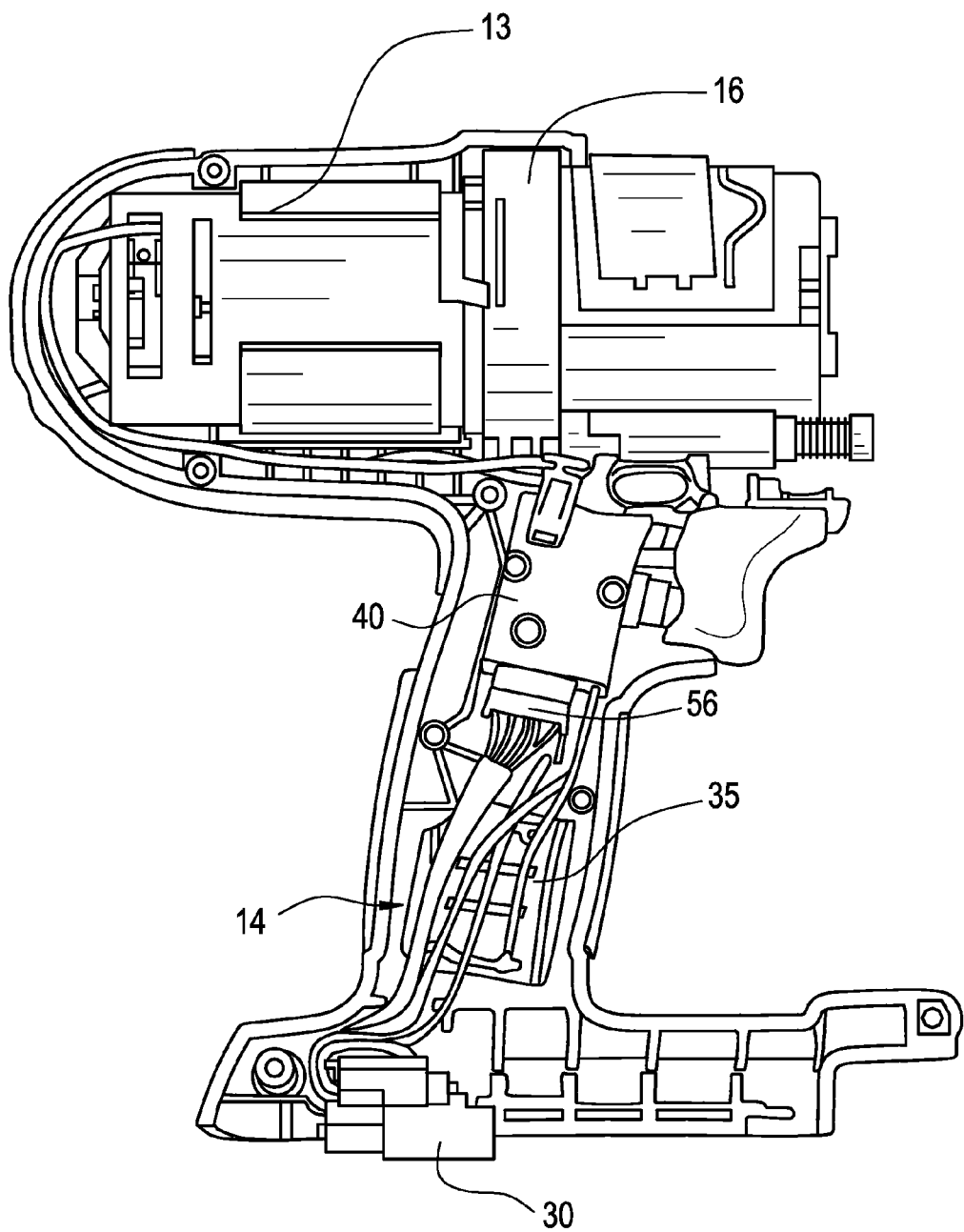
FIG. 3 is a partial perspective view showing a portion of one half shell of the power tool in accordance with an example embodiment of the present invention.

Referring to FIGS. 2 and 3, a tool terminal block 30 is shown disposed at the bottom of the tool 10. The terminal block 30 provides the logic and power terminal connections between the tool 10 and the battery pack. In other words, the terminal block 30 provides the electrical interconnections between the tool and the battery pack. The logic terminal in the terminal block 30 may have a plurality of contacts to matingly interface with contacts on a terminal block (not shown) of the battery pack.

Figure 4:
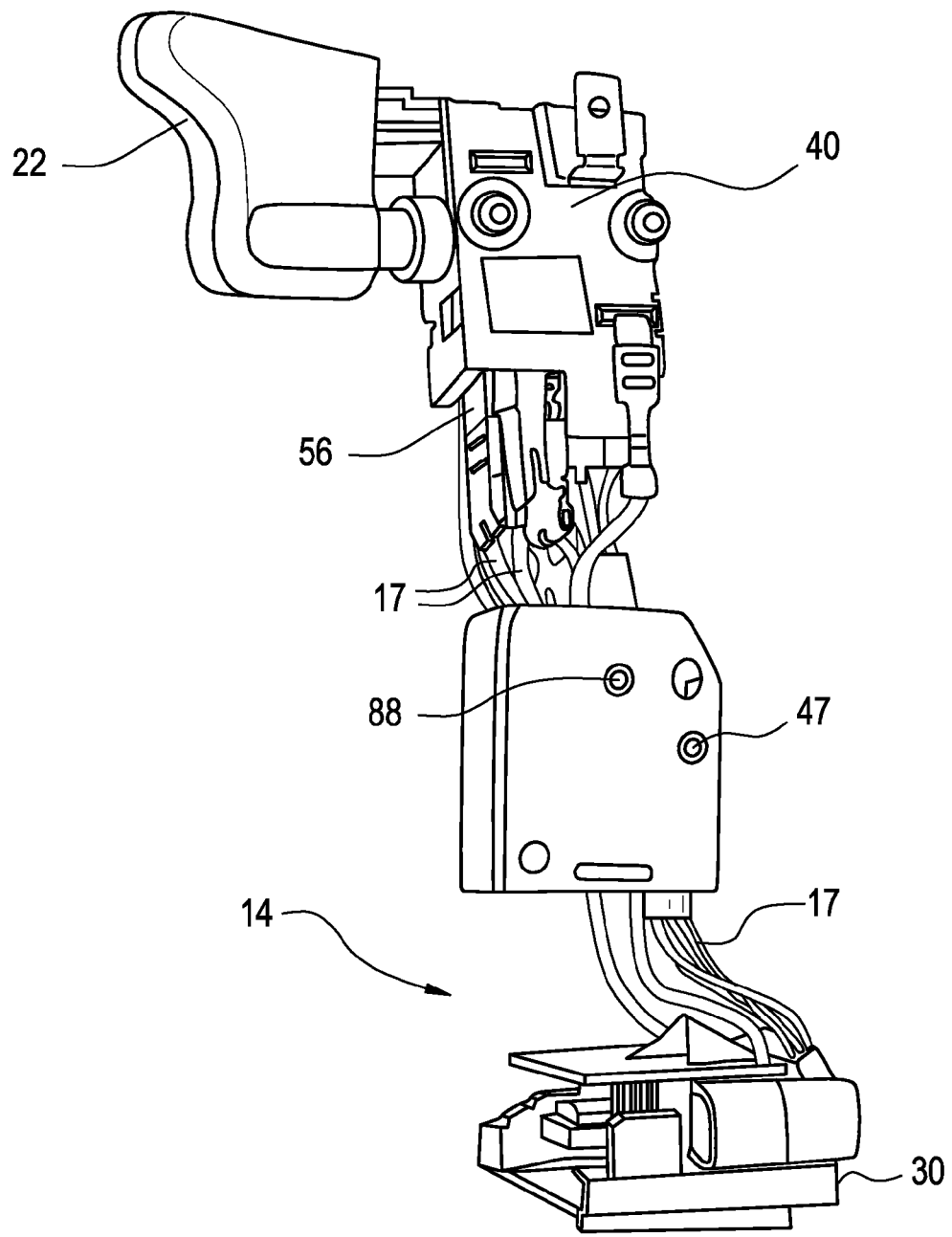
FIG. 4 is a perspective view of a wire harness and a switch in accordance with an example embodiment of the present invention.
Figure 5:
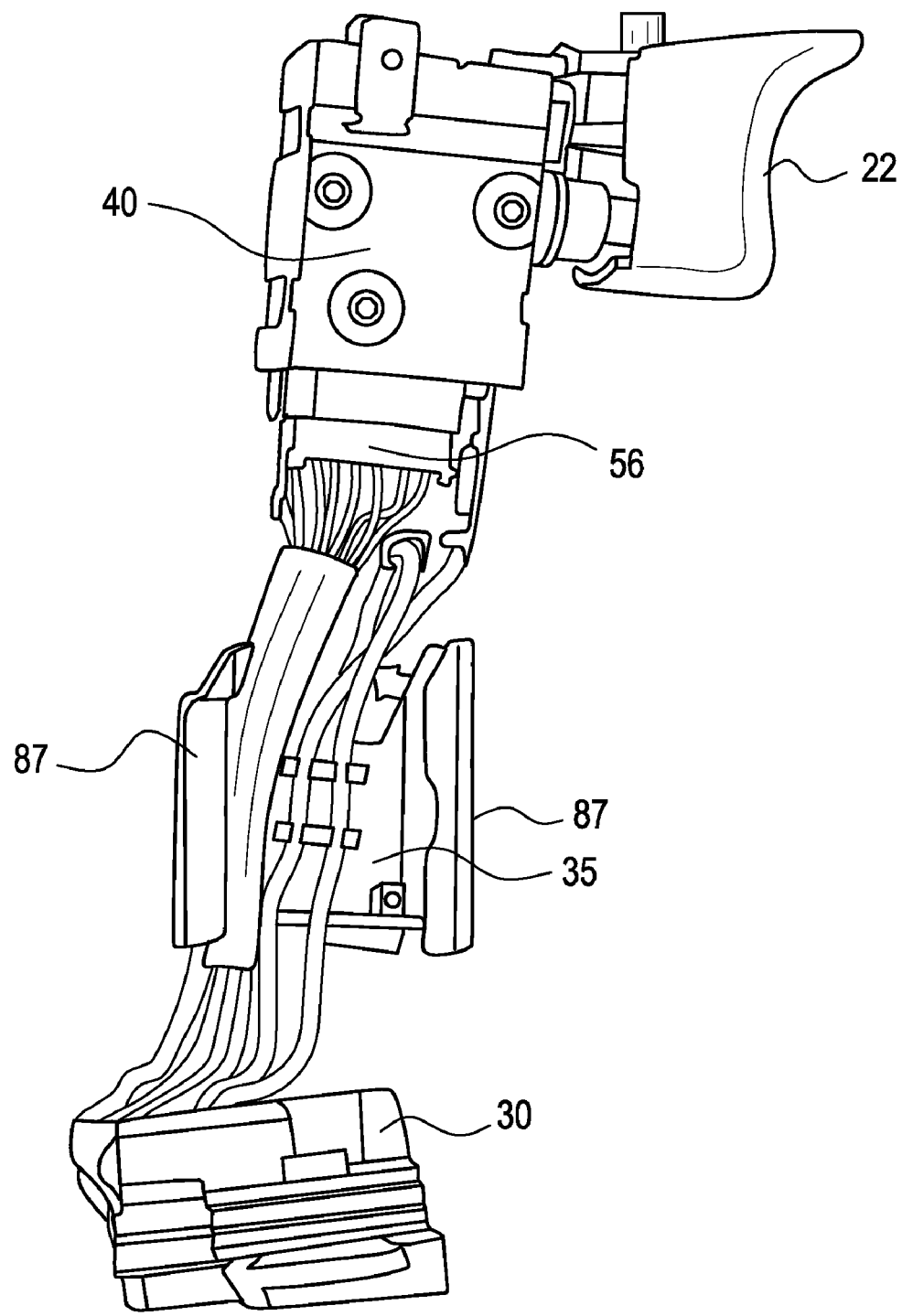
FIG. 5 is a perspective view of a wire harness and a switch in accordance with an example embodiment of the present invention.

FIGS. 4 and 5 are perspective views of a wire harness 14 and a switch 40 in accordance with an example embodiment. The wire harness 14 and switch 40 are integrated in the handle 25 section of the tool 10. Referring to FIG. 4, a trigger 22 is connected to the switch 40 and the switch 40 is connected to a terminal block 30 via lead wires 17. A terminal block 56 is attached to switch 40 for electrical communication with the terminal block 30 in the battery pack. The battery pack terminal block is described in detail in the above noted co-pending '355 application to Casalena et al., it should be appreciated that the switch 40 may have a potentiometer (not shown) to vary the speed of the tool 10.

Figure 7:
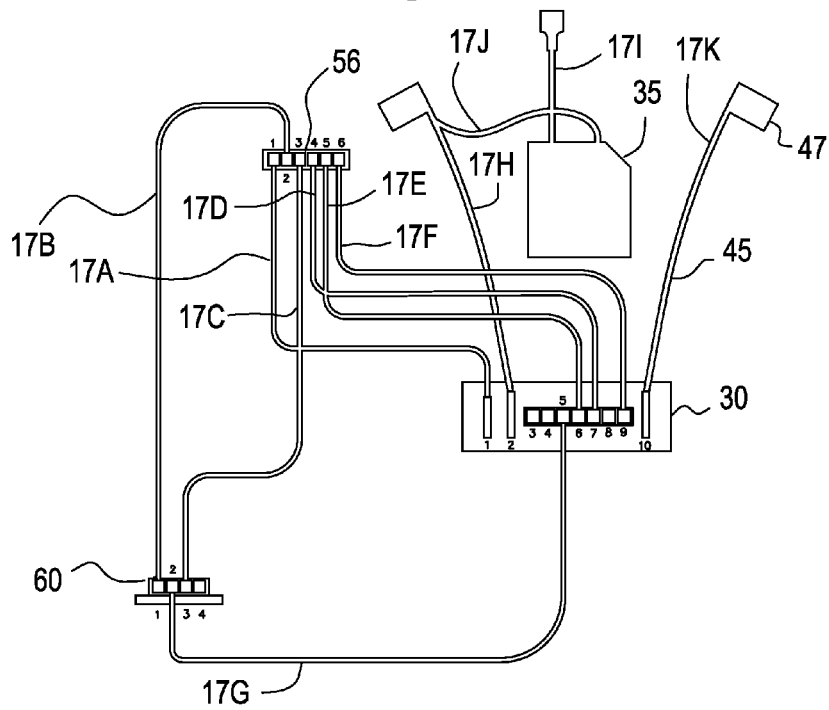
FIG. 7 is a connection schematic of the lead wires in accordance with an example embodiment of the present invention.

As best shown in FIG. 7, a sensor tag 47 adheres to an inside surface (not shown) of the tool housing 12 of the cordless power tool 10. The sensor tag 47 can be made from any conventional composite metal materials. The composite metal material provides a detecting means for signaling a detector (e.g., magnetic sensor detector) to be activated in order to prevent theft.

Figure 6:
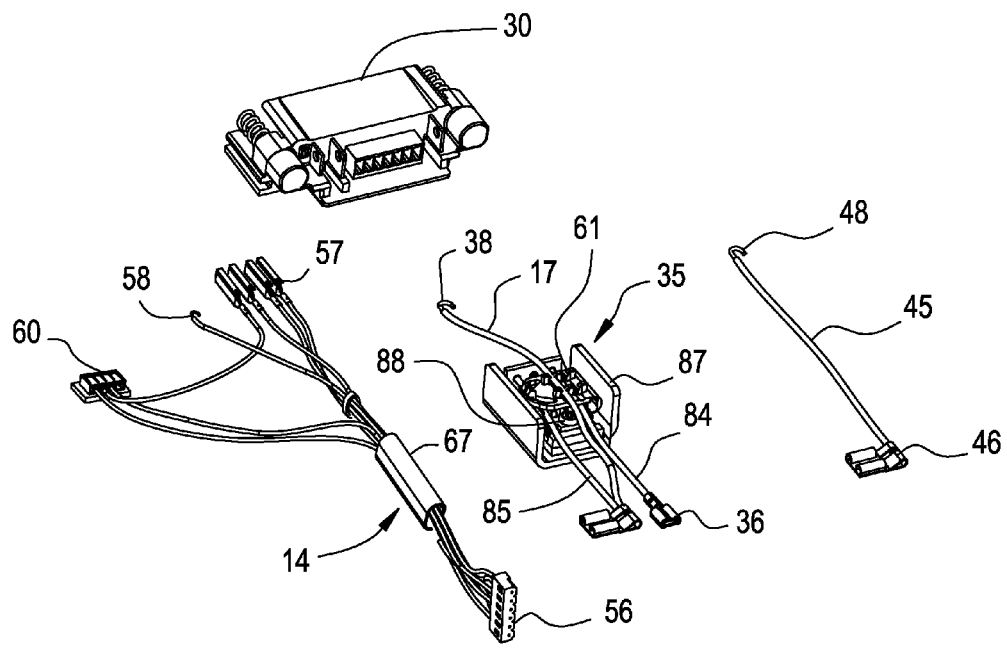
FIG. 6 is an exploded perspective view showing the wire harness in accordance with an example embodiment of the present invention.

FIG. 6 is an exploded perspective view showing the wire harness in separate configuration. Referring to FIG. 6, a wire harness assembly 14, a diode assembly 35, and a tool motor lead wire 45 for connecting the tool motor are shown. The wire harness assembly 14 includes a switch terminal block 56, a printed circuit board (PCB) 60, and a plurality of harness lead wires 17. The harness lead wires 17 connect the switch terminal block 56 to the PCB 60 and to the terminal block 30. The lead wires 17 may be surrounded with an insulating tubular member 67 to neatly encase the harness lead wires 17.

The PCB 60 includes a plurality of surface mount technology (SMT) resistors 62 which will be described in detail later. This allows flexibility in designing other components within the tool 10, and reduces the dimension and size of the tool.

Terminal connectors 57 are attached at one end of the harness lead wires 17 for insertion into logic terminals (not shown) in a backside of the terminal block 30. The terminal connectors 57 may be right-angle board-in connectors, for example. Board-in connectors 57 provide easy of insertion and good retention once inserted into the respective terminal connections 31. The other ends of same lead wires 17 include terminal connectors (not shown) inserted in the terminals of the switch terminal block 56.

The wire harness assembly 14 also includes a diode assembly 35. The diode assembly includes a diode (not shown), a diode wire trap 53, a printed circuit board (PCB) (not shown), and a plurality of diode lead wires 55 extending from the PCB. The diode lead wires 55 may include board-in connectors 39 at ends thereof for connection to various components, such as a switch of a tool motor. The diode assembly 35 is described in detail in co-pending U.S. patent application Ser. No. 11/553,652, to the inventor, filed Oct. 27, 2006 and entitled "REMOTE DIODES IN A CORDLESS TOOL", which is hereby incorporated by reference in its entirety herein.

FIG. 7 is a connection schematic for the harness lead wires 17 in accordance with an example embodiment. Referring to FIG. 7, the terminal block 30 shown includes 10 terminals, the switch terminal block 56 includes 6 terminals, and the PCB connector 60 includes 4 terminals. The connection of the lead wires 17A-17K are illustrated as follows: wire 17A connects terminal 1 of the switch terminal block 56 to terminal 1 of terminal block 30, wire 17B connects terminal 2 of the switch terminal block 56 to terminal 1 of the PCB connector 60, wire 17C connects terminal 3 of the switch terminal block 56 to terminal 3 of PCB connector 60, wire 17D connects terminal 4 of the switch terminal block 56 to terminal 7 of terminal block 30, wire 17E connects terminal 5 of the switch terminal block 56 to terminal 6 of terminal block 30, wire 17F connects terminal 6 of the switch terminal block 56 to terminal 9 of terminal block 30, and wire 17G connects terminal 5 of the terminal block 30 to terminal 2 of the PCB connector 60. Wire 17H is connected to terminal 2 of the terminal block 30 and wire 17K is connected to terminal 10 of the terminal block 30. Wires 17I and 17J extend from the diode assembly 35. It should be appreciated another other connection scheme with a different number of terminals on one or more of terminal block 30, switch terminal block 56 and PCB connector 60 may be employed besides the one described above.

Figure 8:
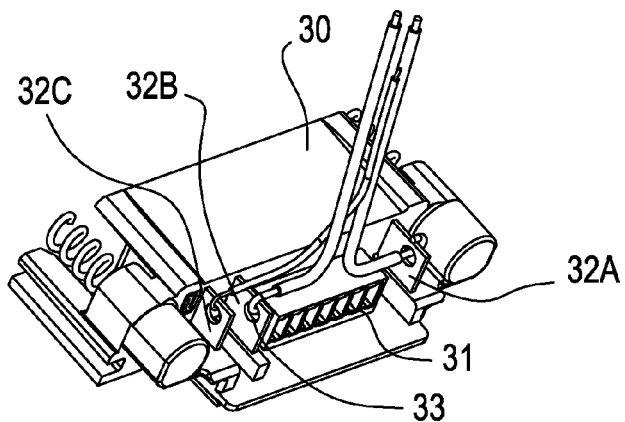
FIG. 8 is a perspective view showing lead wires connected to a terminal block in accordance with an example embodiment of the present invention.

FIG. 8 is a perspective view showing wires connected to a backside of the terminal block 30 in accordance with an example embodiment. Referring to FIG. 8, the backside of the terminal block 30 includes a logic terminal 31 with plurality of contact terminals which receive the terminal connectors 57 for the lead wires 17 and a plurality of blade terminals 32 which are power terminals between the battery pack and tool 10. As an example embodiment, there are two blade terminals 32B, 32C at one side of logic terminal 31 and one blade terminal 32A at the other side of logic terminal 31.

Referring back to FIG. 6, ends 38, 48, 58 of respective diode lead wires 55, tool motor lead wire 45 and harness lead wires 17 have a general J-shape. The J-shaped ends 38, 48, 58 are inserted into respective holes 33 located in blade terminals 32A, 32B, 32C so as to provide a secure connection. Once the ends 38, 48, 58 of corresponding the lead wires 38, 48, 58 are inserted into the respective holes 33, the ends 38, 48, 58 are fixedly attached (such as by soldering with lead-free solder onto the blade terminals 32A, 32B, 32C.

Figure 9:
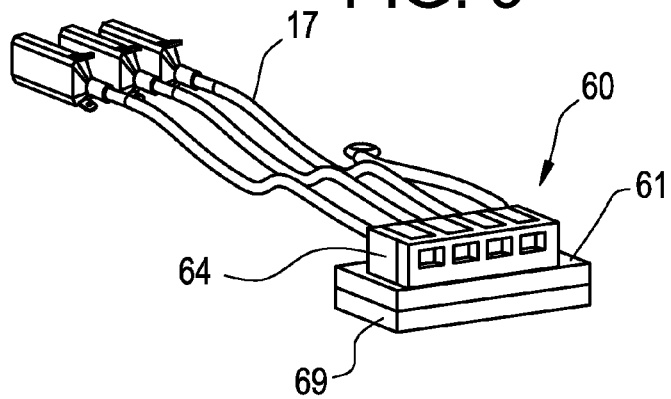
FIG. 9 is a perspective view showing ID resistors connected to a PCB in accordance with an example embodiment of the present invention.
Figure 10:
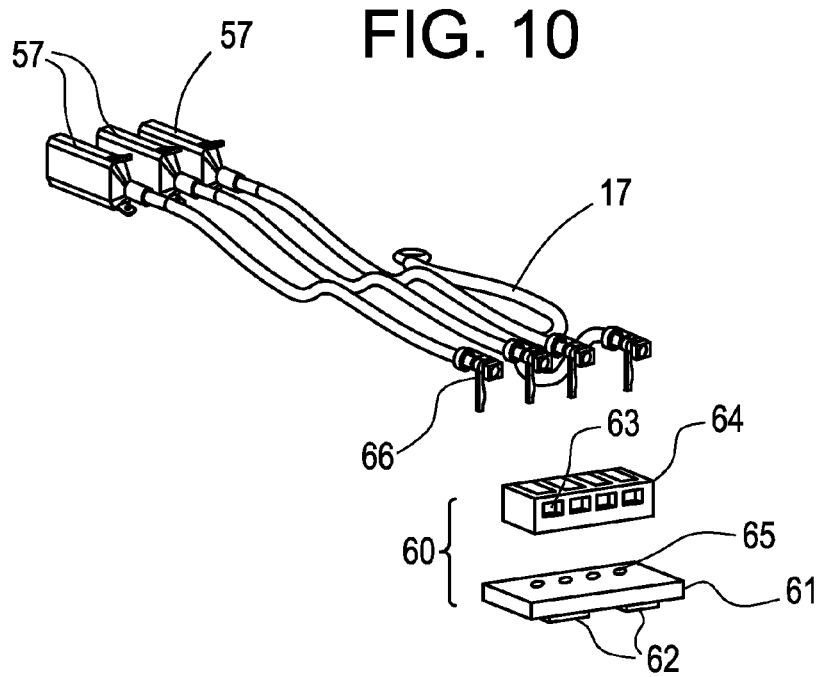
FIG. 10 is an exploded perspective view showing the ID resistor connected to a PCB in accordance with an example embodiment of the present invention.

FIGS. 9 and 10 illustrate ID resistors attached on a PCB connector assembly 60 in accordance with an example embodiment. As shown in FIGS. 9 and 10, the PCB connector assembly 60 includes a PCB 61, a plurality of ID resistors 62 (shown best in FIG. 10), a connector housing 64 and an encapsulant 69 for covering the PCB 61 and protecting the ID resistors 62. The ID resistors 62 may be embodied as a communication received from the terminal block 30 to identify data and resist the current in the battery pack. The ID resistor 62 may be attached to the PCB 61 via a surface mount technology (SMT). The use of SMT resistors 62 allows for reduced size assembly, and allows the resistors 62 to be mounted inside of the tool housing 12 without requiring large space. Alternatively, a small through-hole loaded resistor (not shown) may also be employed. The through-hole resistors can be a more robust construction should the tool environment require it.

The encapsulant 69 covers an entire surface of the PCB 61 to house and protect the ID resistors 62. In addition, the encapsulant 69 may be used to absorb the coefficients of thermal expansion mismatch in the PCB 61, which results in a higher level of reliability. The encapsulant 69 may also cover the exposed soldered ends of wire leads 17 attached to the PCB 61.

The connector housing 64 is attached to a surface of the PCB 61 opposite the surface of the ID resistors 62. By containing the ID resistors 62 in this manner, the connector housing 64 may reduce and/or prevent potential damage due to handling, vibration and/or contamination. The connector housing 64 is attached to the PCB 61 by an adhesive or by mechanical retention features disposed on a bottom underside surface of the connector housing 64 that interfaces with PCB 61.

The connector housing 64 includes 4 terminals 63 for lead wires 17 to be inserted. At the end of each lead wire 17 is a terminal connector 66. The terminal connector 66 is inserted into corresponding terminals located in the connector housing 64. The PCB 61 has a plurality of holes 65 on the surface thereof so the terminal connectors 66 interface and communicate with the ID resistors 62. The lead wires 17 extending from the PCB connector assembly 60 are connected to various terminals in accordance with an example embodiment as illustrated in FIG. 7. By such configuration, this allows the ID resistors 62 to be used and mounted inside the tool housing 12 where there is space (e.g., the ID resistors 62 are incorporated and mounted into the existing wire harness assembly 14 via lead wires 17 without significant redesigning).

The example embodiments being thus described, it will be obvious that the same may be varied in many ways. Such variations are not to be regarded as departure from the spirit and scope of the example embodiments, and all such modifications as would be obvious to one skilled in the art are intended to be included within the scope of the described invention.

What is claimed:

1. A printed circuit board (PCB) connector assembly for a wiring harness, comprising: a PCB; a connector housing disposed on a surface of the PCB; a plurality of ID resistors, for identifying data and limiting voltages through a cordless power tool mounted on the surface of the PCB; and an encapsulant covering the plurality of ID resistors, where the ID resistors are configured to identify information received from a battery pack.

2. The PCB connector assembly according to claim 1, wherein the ID resistors are mounted on a bottom surface of the PCB.

3. The PCB connector assembly according to claim 2, wherein the ID resistors are mounted to the PCB by a surface mount technology (SMT).

4. The PCB connector assembly according to claim 2, wherein the ID resistors are mounted to the PCB by a through-hole loaded resistor.

5. The PCB connector assembly according to claim 1, wherein the connector housing is attached on a top surface of the PCB.

6. The PCB connector assembly according to claim 1, wherein the ID resistors are mounted on a surface of the PCB opposite the surface of the connector housing.

7. The PCB connector assembly according to claim 1, wherein the encapsulant covers an entire surface of the PCB.

8. The PCB connector assembly according to claim 7, wherein the encapsulant additionally covers exposed soldered wire lead ends that are attached to the PCB.

9. The PCB connector assembly according to claim 1, wherein the PCB connector assembly is configured in a cordless power tool.

10. The PCB connector assembly according to claim 1, wherein the ID resistors are configured to resist current from the battery pack.

11. The PCB connector assembly according to claim 1, further comprising a plurality of holes in the PCB through which terminal connectors pass through and communicate with the ID resistors.

* * * * *